United States Patent
Disney et al.

(10) Patent No.: US 9,318,619 B2
(45) Date of Patent: *Apr. 19, 2016

(54) VERTICAL GALLIUM NITRIDE JFET WITH GATE AND SOURCE ELECTRODES ON REGROWN GATE

(71) Applicant: Avogy, Inc., San Jose, CA (US)

(72) Inventors: Donald R. Disney, Cupertino, CA (US); Hui Nie, Cupertino, CA (US); Isik C. Kizilyalli, San Francisco, CA (US); Richard J. Brown, Los Gatos, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/606,822

(22) Filed: Jan. 27, 2015

(65) Prior Publication Data

US 2015/0137140 A1 May 21, 2015

Related U.S. Application Data

(63) Continuation of application No. 14/192,662, filed on Feb. 27, 2014, now Pat. No. 8,946,725, which is a continuation of application No. 13/315,720, filed on Dec. 9, 2011, now Pat. No. 8,698,164.

(51) Int. Cl.
*H01L 29/808* (2006.01)
*H01L 29/70* (2006.01)
(Continued)

(52) U.S. Cl.
CPC ........ *H01L 29/8083* (2013.01); *H01L 29/0623* (2013.01); *H01L 29/2003* (2013.01);
(Continued)

(58) Field of Classification Search
CPC ............ H01L 29/8083; H01L 29/2003; H01L 29/66909
USPC ............ 257/76, 266, 458, 471, 483, 484, 489
See application file for complete search history.

(56) References Cited

U.S. PATENT DOCUMENTS

| 8,502,234 B2 | 8/2013 | Kizilyalli et al. |
| 2004/0124435 A1 | 7/2004 | D'Evelyn et al. |

(Continued)

FOREIGN PATENT DOCUMENTS

| CN | 102074587 A | 5/2011 |
| CN | 102136501 A | 7/2011 |

(Continued)

OTHER PUBLICATIONS

Notification of Transmittal of the International Search Report and The Written Opinion of the International Searching Authority, or The Declaration and International Search Report and Written Opinion of the International Searching Authority for International Application No. PCT/US2012/066669 mailed on Feb. 11, 2013, 10 pages.

(Continued)

*Primary Examiner* — Mamadou Diallo
(74) *Attorney, Agent, or Firm* — Kilpatrick Townsend & Stockton LLP

(57) ABSTRACT

A semiconductor structure includes a GaN substrate with a first surface and a second surface. The GaN substrate is characterized by a first conductivity type and a first dopant concentration. A first electrode is electrically coupled to the second surface of the GaN substrate. The semiconductor structure further includes a first GaN epitaxial layer of the first conductivity type coupled to the first surface of the GaN substrate and a second GaN layer of a second conductivity type coupled to the first GaN epitaxial layer. The first GaN epitaxial layer comprises a channel region. The second GaN epitaxial layer comprises a gate region and an edge termination structure. A second electrode coupled to the gate region and a third electrode coupled to the channel region are both disposed within the edge termination structure.

20 Claims, 8 Drawing Sheets

(51) Int. Cl.
*H01L 29/40* (2006.01)
*H01L 29/66* (2006.01)
*H01L 29/06* (2006.01)
*H01L 29/20* (2006.01)

(52) U.S. Cl.
CPC ........ *H01L29/402* (2013.01); *H01L 29/66446* (2013.01); *H01L 29/66462* (2013.01); *H01L 29/66909* (2013.01); *H01L 29/66924* (2013.01)

(56) References Cited

U.S. PATENT DOCUMENTS

| | | |
|---|---|---|
| 2007/0029573 A1 | 2/2007 | Cheng et al. |
| 2010/0148186 A1 | 6/2010 | Sheridan et al. |
| 2010/0327318 A1 | 12/2010 | Okamoto et al. |
| 2013/0032814 A1 | 2/2013 | Bour et al. |
| 2013/0087835 A1 | 4/2013 | Edwards et al. |
| 2013/0126885 A1 | 5/2013 | Disney et al. |
| 2013/0146886 A1 | 6/2013 | Disney et al. |
| 2013/0164893 A1 | 6/2013 | Romano et al. |

FOREIGN PATENT DOCUMENTS

| | | |
|---|---|---|
| JP | 2006253292 A | 9/2006 |
| WO | 2010148266 A2 | 12/2010 |

OTHER PUBLICATIONS

Final Office Action for U.S. Appl. No. 13/315,720 mailed Oct. 3, 2013, 5 pages.
Non-Final Office Action for U.S. Appl. No. 13/315,720 mailed May 1, 2013, 16 pages.
Notice of Allowance for U.S. Appl. No. 13/315,720 mailed Nov. 27, 2013, 13 pages.
Notice of Allowance for U.S. Appl. No. 14/192,662 mailed Sep. 29, 2014, 8 pages.
CN201280060650.4, "Office Action", Nov. 11, 2015, 6 pages.

VERTICAL GALLIUM NITRIDE JFET WITH GATE AND SOURCE ELECTRODES ON REGROWN GATE

CROSS-REFERENCES TO RELATED APPLICATIONS

This application is a continuation of U.S. patent application Ser. No. 14/192,662, filed on Feb. 27, 2014, which is a continuation of U.S. patent application Ser. No. 13/315,720, filed on Dec. 9, 2011, which is related to U.S. patent application Ser. No. 13/270,606, filed on Oct. 11, 2011, the disclosures of which are incorporated by reference herein in their entirety for all purposes.

BACKGROUND

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY

The present invention relates generally to electronic devices. More specifically, the present invention relates to forming power transistors using III-nitride semiconductor materials. Merely by way of example, the invention has been applied to methods and systems for manufacturing a vertical JFET power transistor using gallium-nitride (GaN) based epitaxial layers. The methods and techniques can be applied to a variety of compound semiconductor systems such as vertical metal-oxide-semiconductor field-effect transistors (MOSFETs), high electron mobility transistors (HEMTs), thyristors, bipolar transistors, and other devices. In some embodiments, the wherein the edge termination structure includes a plurality of edge termination rings arranged concentrically.

Embodiments of the present invention provide a vertical power device. The vertical power device includes a III-nitride substrate having an upper surface and an opposing lower surface, a first III-nitride epitaxial layer having a first conductivity type coupled to the upper surface, a second III-nitride layer having a second conductivity coupled the first III-nitride layer, a first electrode coupled to the first III-nitride layer, a second electrode coupled to the second III-nitride layer, and an edge termination structure surrounding the first electrode and the second electrode.

Some embodiments of the present invention provide a vertical power device. The vertical power device includes a gallium nitride (GaN) substrate having a top surface and a bottom surface, a GaN drift region coupled to and disposed over the top surface, a channel region coupled to and disposed over the GaN drift region, a gate region that is characterized by a continuous gate structure coupled to a plurality of finger-like gate structures, a gate electrode coupled to the gate region, a source electrode coupled to the channel region, and an edge termination structure surrounding the gate electrode and the source electrode.

Other embodiments of the present invention provide a method of fabricating a power device. The method includes providing a gallium nitride (GaN) substrate having an upper surface and a lower surface, forming a first GaN layer that has n-type conductivity coupled to the upper surface where the first GaN layer includes a channel region, forming a second GaN layer having p-type conductivity coupled to the first GaN layer and forming an edge termination structure and a gate region in the second GaN layer. The method further includes forming a source region having n-type conductivity coupled to the second GaN layer, forming a gate electrode coupled to the gate region, forming a source electrode coupled to the source region, and forming a drain electrode coupled to the lower surface of the GaN substrate. In this embodiment, the edge termination structure surrounds the gate electrode and the source electrode.

Numerous benefits are achieved by way of the present invention over conventional techniques. For example, embodiments of the present invention enable the use of a continuous gate structure in vertical device configurations, which provides devices capable of operating at higher voltages and lower resistance than conventional devices. Additionally, a continuous gate region allows the edge termination region to surround all low-voltage areas of the device (e.g. the gate and source regions) for reduced size and simplified processing. These and other embodiments of the invention, along with many of its advantages and features, are described in more detail in conjunction with the text below and attached figures.

DETAILED DESCRIPTION OF SPECIFIC EMBODIMENTS

Figure 1:
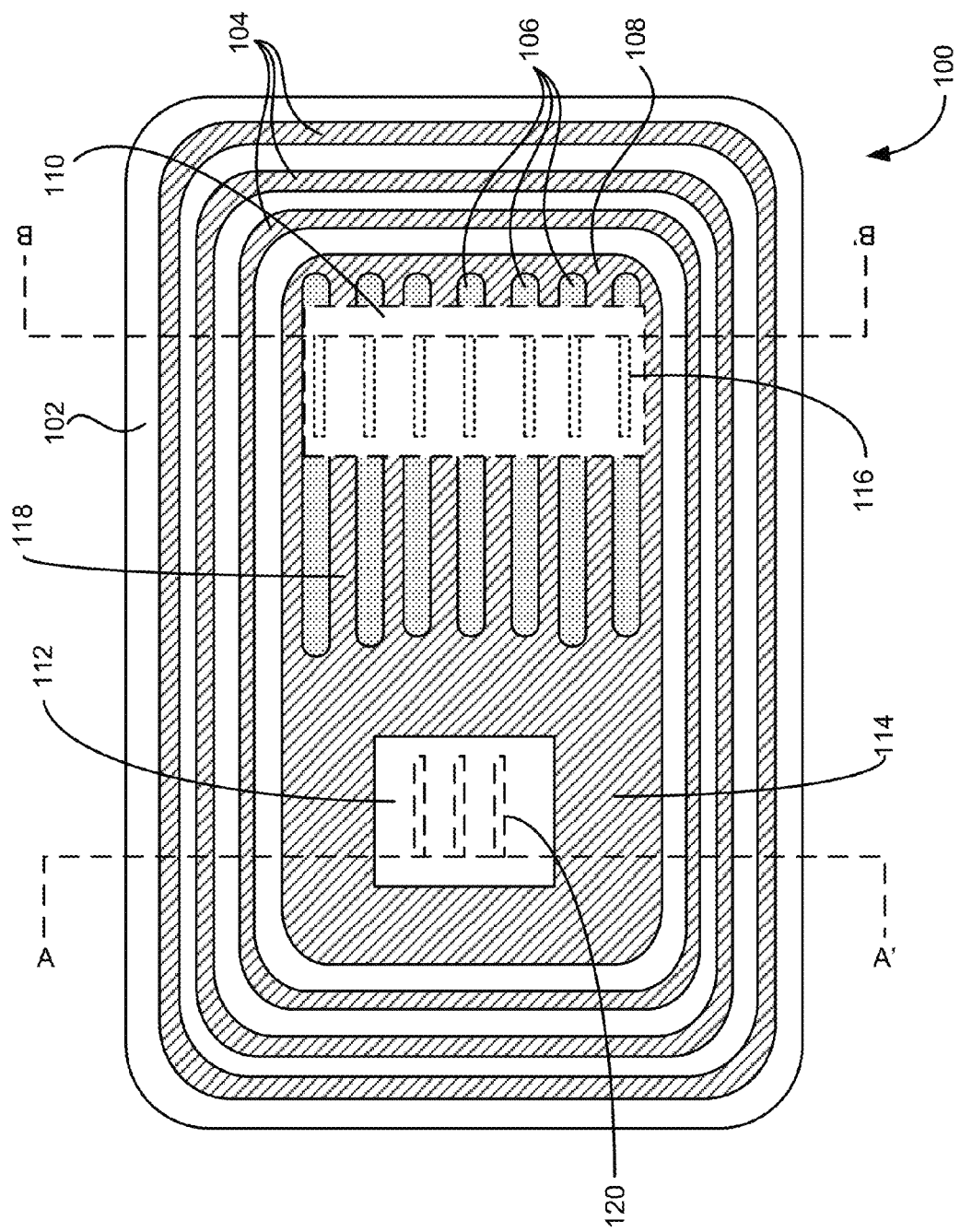
FIG. 1 illustrates a top view of a power device according to an embodiment of the present invention.

Embodiments of the present invention relate to electronic devices. More specifically, the present invention relates to forming vertical power semiconductor devices. Merely by way of example, the invention has been applied to methods and systems for manufacturing a vertical JFET using gallium-nitride (GaN) based epitaxial layers. The methods and techniques can be applied to form a variety of types of semiconductor devices, including, but not limited to, vertical metal-oxide-semiconductor field-effect transistors (MOSFETs), high electron mobility transistors (HEMTs), thyristors, bipolar transistors, and other devices.

GaN-based electronic and optoelectronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, μ, is higher than competing materials for a given background doping level, N. This provides low resistivity, ρ, because resistivity is inversely proportional to electron mobility, as provided by equation (1):

$$\rho = \frac{1}{q\mu N}, \quad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \rho L/A, \quad (2)$$

where A is the cross-sectional area of the channel or current path.

As described herein, semiconductor devices utilizing edge termination structures are able to exploit the high critical electric field provided by GaN and related alloys and heterostructures. Edge termination techniques such as field plates and guard rings provide proper edge termination by alleviating high fields at the edge of the semiconductor device. When properly employed, edge termination allows a semiconductor device to break down uniformly at its main junction rather than uncontrollably at its edge. In addition, utilizing edge termination structures as described herein to completely surround the low voltage gate and source regions, results in smaller devices, simplified processing, and more reliable operation.

According to embodiments of the present invention, gallium nitride (GaN) epitaxy on pseudo-bulk GaN substrates is utilized to fabricate edge termination structures and/or semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create edge termination structures for various types of semiconductor devices.

FIG. 1 illustrates a top-view of a vertical power device 100 including the guard rings according to an embodiment of the present invention. Processes for the fabrication of vertical power device 100 is provided in commonly assigned U.S. patent application Ser. No. 13/289,219, filed on Nov. 4, 2011, the disclosure of which is hereby incorporated by reference. Details related to fabricating edge termination structures are provided in the following commonly assigned U.S. Patent Applications:

(a) U.S. patent application Ser. No. 13/270,606, filed on Oct. 11, 2011, published as U.S. Patent Application Publication No. 2013/0087835, (b) U.S. patent application Ser. No. 13/299,254, filed on Nov. 17, 2011, published as U.S. Patent Application Publication No. 2013/0126885, and (c) U.S. patent application Ser. No. 13/335,355, filed on Dec. 22, 2011, published as U.S. Patent Application Publication No. 2013/0164893, the disclosures of which are incorporated by reference herein in their entirety for all purposes.

Vertical power device 100 includes a first III-nitride layer 102 that is coupled to a substrate (not shown). In some embodiments, the substrate is a III-nitride substrate. In a particular embodiment, the substrate can be a gallium nitride (GaN) substrate. In some embodiments, first III-nitride layer 102 can include an epitaxially grown III-nitride layer, e.g., GaN, that has n-type conductivity. First III-nitride layer 102 can serve as a drift region and therefore can be a relatively low-doped material. For example, first III-nitride layer 102 can have an n-conductivity type, with dopant concentrations ranging from $1 \times 10^{14}$ cm$^{-3}$ to $1 \times 10^{18}$ cm$^{-3}$. Furthermore, the dopant concentration can be uniform, or can vary, for example, as a function of the thickness of the drift region. In some embodiments, n-type dopants can include silicon, oxygen, selenium, tellurium, or the like.

The thickness of first III-nitride layer 102 can also vary substantially, depending on the desired functionality. As discussed above, homoepitaxial growth can enable first III-nitride layer 102 to be grown far thicker than layers formed using conventional methods. In general, in some embodiments, thicknesses can vary between 0.5 μm and 100 μm, for example. In other embodiments thicknesses are greater than 5 μm. Resulting parallel plane breakdown voltages for vertical power device 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

A second III-nitride layer 108 can be epitaxially grown over first III-nitride layer 102. In some embodiments, second III-nitride layer may comprise GaN. Second III-nitride layer 108, from which edge termination structures 104 are eventually formed, can have a conductivity type different than first III-nitride layer 102. For instance, if first III-nitride layer 102 is formed from an n-type GaN material, second III-nitride layer 108 may be formed from a p-type GaN material, and vice versa. In some embodiments, second III-nitride layer 108 is used to form the edge termination structures and is a continuous regrowth over portions of first III-nitride layer 102 with other portions of the structure, such as regions of other semiconductor devices, characterized by reduced or no growth as a result of the presence of a regrowth mask (not shown). One of ordinary skill in the art would recognize many variations, modifications, and alternatives.

The thickness of second III-nitride layer 108 can vary, depending on the process used to form the layer and the device design. In some embodiments, the thickness of second III-nitride layer 108 is between 0.1 μm and 5 μm.

Second III-nitride layer 108 can be highly doped, for example in a range from about $5 \times 10^{17}$ cm$^{-3}$ to about $1 \times 10^{19}$ cm$^{-3}$. Additionally, as with other epitaxial layers, the dopant concentration of second III-nitride layer 108 can be uniform or non-uniform as a function of thickness. In some embodiments, the dopant concentration increases with thickness, such that the dopant concentration is relatively low near first III-nitride layer 102 and increases as the distance from first III-nitride layer 102 increases. Such embodiments provide higher dopant concentrations at the top of second III-nitride layer 108 where metal contacts can be subsequently formed. Other embodiments utilize heavily doped contact layers (not shown) to form Ohmic contacts.

One method of forming second III-nitride layer 108, and other layers described herein, can be through a regrowth process that uses an in-situ etch and diffusion preparation processes. These preparation processes are described more fully in U.S. patent application Ser. No. 13/198,666, filed on Aug. 4, 2011, the disclosure of which is hereby incorporated by reference in its entirety. Second III-nitride layer 108 can be used to form the gate region of vertical power device 100.

Vertical power device 100 further includes an edge termination region. In the embodiment shown in FIG. 1, the edge termination region comprises one or more edge termination structures 104. In one embodiment, edge termination structures 104 are formed by removing at least a portion of second III-nitride layer 108. The removal can be performed by a controlled etch using an etch mask (not shown but having the dimensions of the edge termination structures 104) designed to stop at approximately the interface between second III-nitride layer 108 and first III-nitride layer 102. Inductively-coupled plasma (ICP) etching and/or other common GaN etching processes can be used. In other embodiments, edge termination structures 104 may be formed by implanting ions into portions of second III-nitride layer 108 to electrically isolate edge termination structures 104. In still other embodiments, the edge termination region may comprise a junction-termination extension (JTE) region, one or more field plates, deep trench termination, and/or a combination of these or other edge termination structures.

As illustrated in FIG. 1, second III-nitride layer/gate region 108 includes a continuous region 114 and one or more finger-like projections 118. Together continuous region 114 and projections 118 form the gate region of vertical power device 100. A gate electrode 112 is disposed over continuous region 114 and coupled to gate region 108 via gate contacts 120. In some embodiments, gate electrode 112 can include metals such as nickel, platinum, palladium, silver, gold, copper, etc. and alloys thereof. In some embodiments, gate electrode 112 can be a multi-layered structure.

In one embodiment, at least some portions of the gate region may also include a low resistance layer (not shown) that may be disposed on top of the second III-nitride layer. This low resistance layer may comprise a metal such as platinum, titanium, or other suitable materials. The purpose of this layer is to reduce the lateral resistance from gate electrode 112 to various locations on the gate region, which may be advantageous to reduce the distributed gate resistance of vertical power device 100 and, thus, improve the switching performance.

First III-nitride layer 102 can be patterned and etched to form channel regions 106. Channel regions 106 are disposed such that there is one channel region in between two adjacent finger-like gate structures 118. These together form the p-n junction of a diode. Details of the placement of the source and gate structures is described more fully below. In one embodiment, a third III-nitride layer (not shown) is coupled to first III-nitride layer 102 and is etched to form channel regions 106. A source electrode 110 is coupled to channel regions 106 via source contacts 116. In some embodiments, source regions are interposed between channel regions 106 and source contacts 116, as described in reference to FIG. 3 below. In some embodiments, source electrode 110 can include metals such as titanium, aluminum, nickel, gold, etc. and alloys thereof. In some embodiments, source electrode 110 can be a multi-layered structured.

As illustrated in FIG. 1, both source electrode 110 and gate electrode 112 are disposed within the innermost edge termination structure 104. This helps to isolate the low voltage gate and source electrodes from the high voltage of first III-nitride layer 102. Connections to external systems can be made via electrodes 110 and 112 using wire bonding or other conventional techniques.

Although some embodiments are discussed in terms of GaN substrates and GaN epitaxial layers, the present invention is not limited to these particular binary III-V materials and is applicable to a broader class of III-V materials, in particular III-nitride materials. Additionally, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

The vertical power device 100 utilizes an n-type drift layer that is grown on top of an n-type substrate. However, the present invention is not limited to this particular configuration. In other embodiments, substrates with p-type doping can be utilized. Additionally, embodiments can use materials having an opposite conductivity type to provide devices with different functionality. Thus, although some embodiments described herein include n-type GaN epitaxial layer(s) doped with silicon, in other embodiments highly or lightly doped material, p-type material, material doped with dopants in addition to or other than silicon such as Mg, Ca, Be, Ge, Se, S, O, Te, and the like can also be used. The substrates discussed herein can include a single material system or multiple material systems including composite structures of multiple layers. One of ordinary skill in the art would recognize many variations, modifications, and alternatives.

Figure 2:
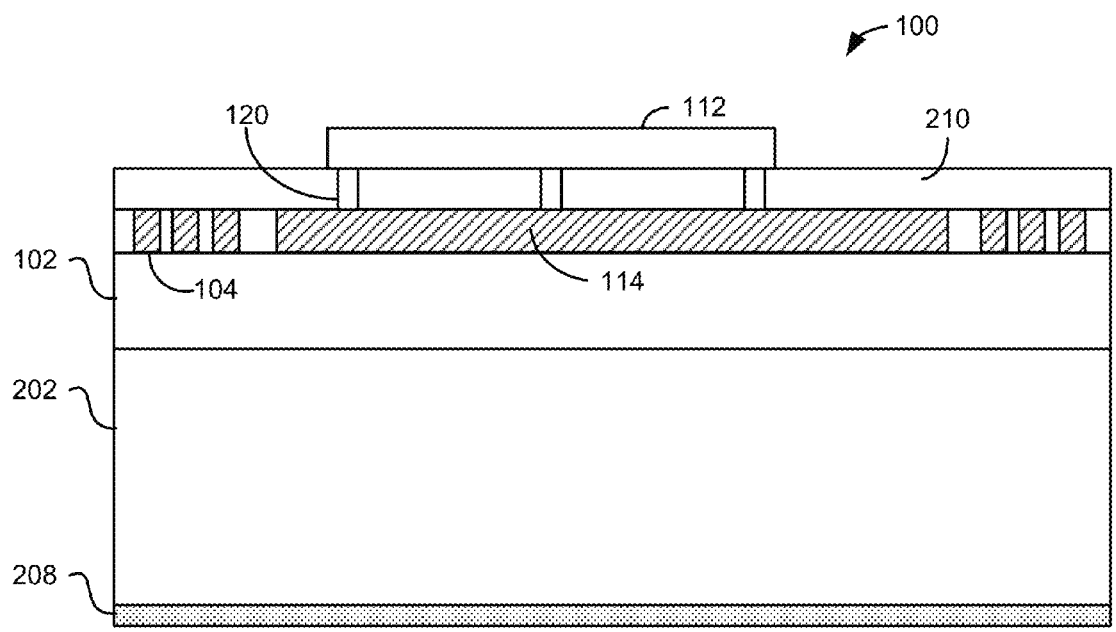
FIG. 2 is a cross-sectional view along the A-A' direction illustrated in FIG. 1.

FIG. 2 illustrates a cross-sectional view of vertical power device 100 taken along the A-A' line illustrated in FIG. 1. As illustrated in FIG. 2, vertical power device 100 includes a GaN substrate 202. A first GaN epitaxial layer 102 is coupled to and disposed over a surface of GaN substrate 202. A drain electrode 208 is coupled to an opposing surface of GaN substrate 202. In one embodiment, drain electrode 208 is formed from titanium, aluminum, nickel, gold, or similar materials to provide an Ohmic contact. A second GaN epitaxial layer is disposed over and coupled to first GaN epitaxial layer 102. The second GaN epitaxial layer comprises continuous gate structure 114 and an edge termination region. As discussed above, the edge termination region may comprise multiple edge termination structures. The example of FIGS. 1 and 2 show three edge termination structures 104.

An interlayer dielectric layer 210 is disposed over the gate structure 114 and edge termination structures 104. One or more gate contacts 120 are formed in interlayer dielectric layer 210 to provide electrical connection between gate structure 114 and gate electrode 112. As can be seen, gate electrode 112 is located such that edge termination structures 104 completely surround gate electrode 112, thereby isolating gate electrode 112 from the high voltage present on the portion of first GaN epitaxial layer 102 that lies outside of the edge termination region.

Figure 3:
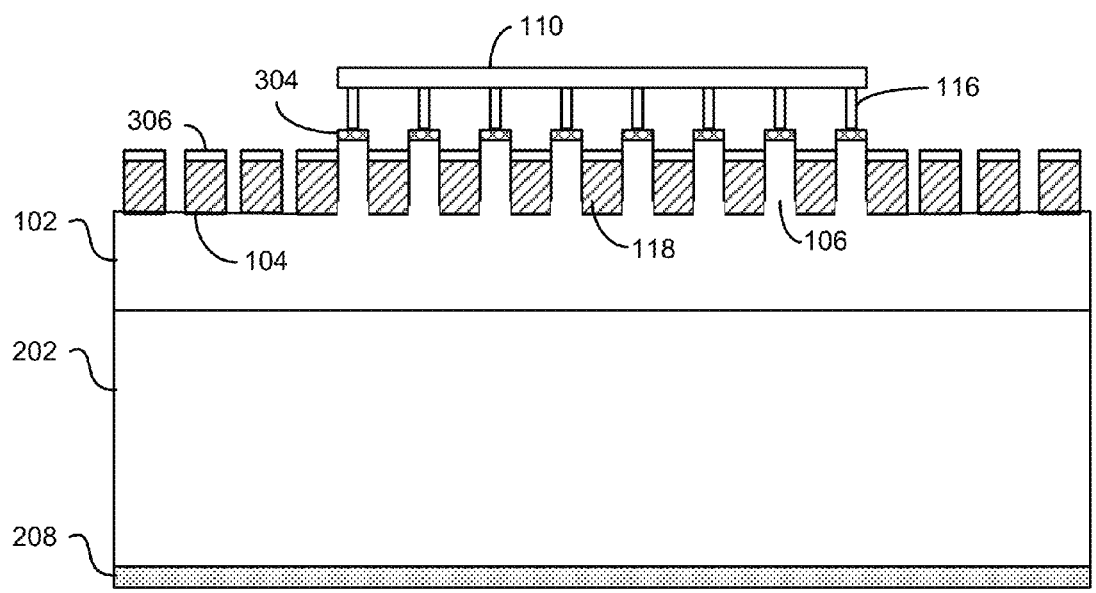
FIG. 3 is a cross-sectional view along the B-B' direction illustrated in FIG. 1.

FIG. 3 illustrates a cross section view of vertical power device 100 at the B-B' line illustrated in FIG. 1. As illustrated in FIG. 3, channel regions 106 are disposed between adjacent finger-like projections 118 of gate region 108, creating p-n junctions. In one embodiment, a low resistance layer 306 is disposed on top of the at least some portions of gate region 108 and/or edge structures 104. Low resistance layer 306 may comprise a metal such as platinum, titanium, or other suitable materials. The purpose of low resistance layer 306 is to reduce the lateral resistance from gate electrode 112 to various locations on the gate region, which may be advantageous to reduce the distributed gate resistance of vertical power device 100 and, thus, improve the switching performance.

Source regions 304 are disposed on the top of channel regions 106. Source regions 304 may have the same conductivity type (e.g. N-type) as channel regions 106 and substrate 202. The doping concentration of source regions 304 may be substantially higher than the doping concentration of channel regions 106 in order to form a better Ohmic contact. Source electrode 110 is disposed within edge termination structures 104. Each source region 304 is electrically coupled to source electrode 110 via source contacts 116. In one embodiment, source regions 304 are electrically isolated from gate region 108. For example, as shown in FIG. 3, the tops of finger-like projections 118 may be recessed below the tops of source regions 304 to provide electrical isolation.

In some embodiments, GaN substrate 202 can have an n+ conductivity type with dopant concentrations ranging from $1\times10^{17}$ cm$^{-3}$ to $1\times10^{19}$ cm$^{-3}$, and first GaN epitaxial layer 102 can have a n− conductivity type, with dopant concentrations ranging from $1\times10^{14}$ cm$^{-3}$ to $1\times10^{18}$ cm$^{-3}$. The thickness of first GaN epitaxial layer 102 can be anywhere from 0.5 μm and 100 μm or higher, depending on desired functionality and breakdown voltage. Channel region 106 can have a height of between 0.5 μm and 5 μm, a width of between 0.5 μm and 5 μm, and an n-type conductivity with a dopant concentration that is the same as or lower than the dopant concentration of first GaN epitaxial layer 102. In one embodiment, channel region 106 can be formed by etching away portions of first GaN epitaxial layer 102. Gate region 108 and the edge termination structures 104 can be from 0.1 μm and 5 μm thick and have a p+ conductivity type with dopant concentrations in a range from about $1\times10^{17}$ cm$^{-3}$ to about $1\times10^{19}$ cm$^{-3}$.

Figure 4:
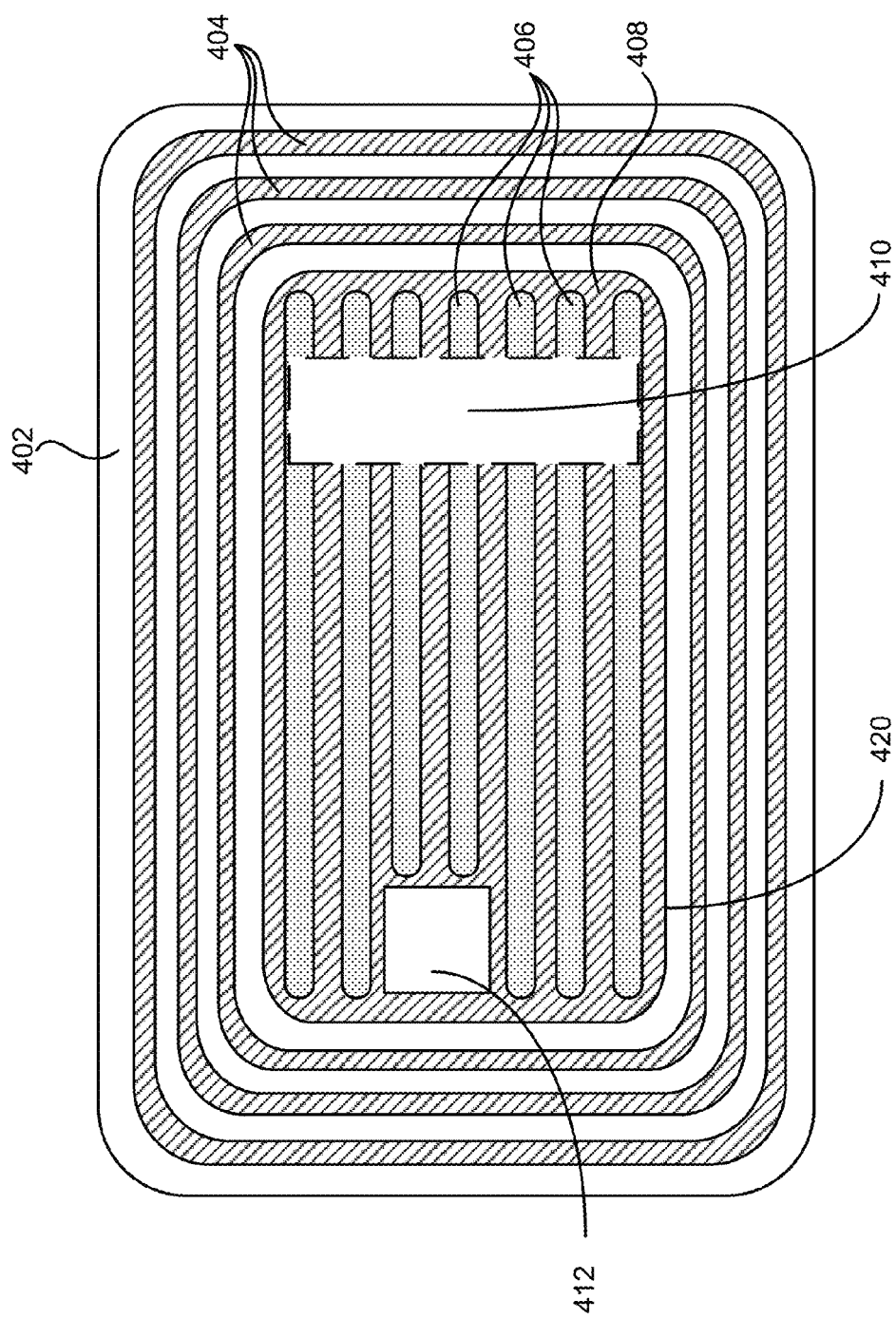
FIG. 4 illustrates a top view of a power device according to another embodiment of the present invention.

FIG. 4 is a top view of a vertical power device 400 according to another embodiment of the present invention. In some embodiments, vertical power device 400 can be a vertical junction field effect transistor (VJFET). Vertical power device 400 includes a GaN epitaxial layer 402 that is disposed on a GaN substrate (not shown). One or more edge termination structures 404 and gate region 408 are formed from an epitaxially grown GaN layer having a conductivity that is opposite to the conductivity of GaN channel region 402. In this embodiment, channel region 406 is formed in the shape of elongated structures having varying lengths. As illustrated in FIG. 4, some channel regions 406 extend the distance of an inner region 420 on either side of gate electrode 412, which is coupled to gate region 408. Source electrode 410 is coupled to channel regions 406. Source electrode 410 and gate electrode 412 completely lie within the edge termination structure 404.

FIGS. 5A-7B illustrate cross-sectional views during various steps in the fabrication of vertical power device with edge termination structures according to an embodiment of the present invention. In this instance, the vertical power device is a VJFET.

Figure 5A:
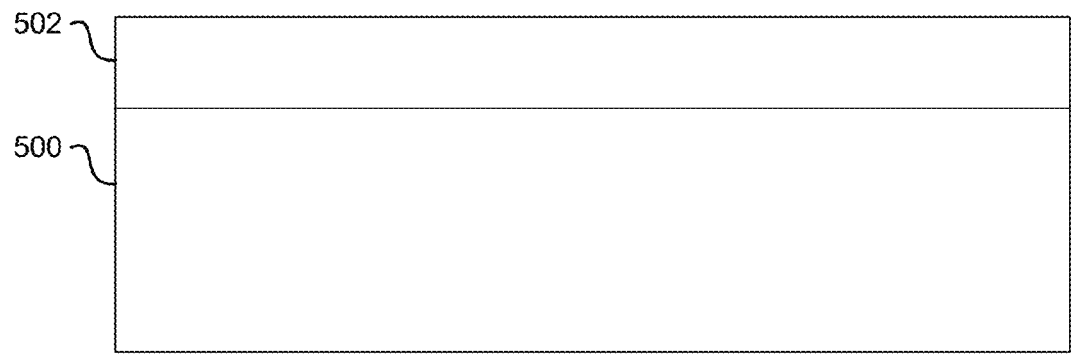
FIGS. 5A-7B illustrate cross-sectional views during various steps in the fabrication of vertical power device with edge termination structures according to an embodiment of the present invention.

As illustrated in FIG. 5A, a first GaN epitaxial layer 502 is formed on a GaN substrate 500 having the same conductivity type. As indicated above, GaN substrate 500 can be a pseudo-bulk or bulk GaN material on which first GaN epitaxial layer 502 is grown. Dopant concentrations (e.g., doping density) of GaN substrate 500 can vary, depending on desired functionality. For example, GaN substrate 500 can have an n+ conductivity type, with dopant concentrations ranging from $1\times10^{17}$ cm$^{-3}$ to $1\times10^{19}$ cm$^{-3}$. Although GaN substrate 500 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of first GaN epitaxial layer 502 can also vary, depending on desired functionality. First GaN epitaxial layer 502 can serve as a drift region for the vertical JFET device, and therefore can be a relatively low-doped material. For example, first GaN epitaxial layer 502 can have an n− conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region.

Figure 5B:
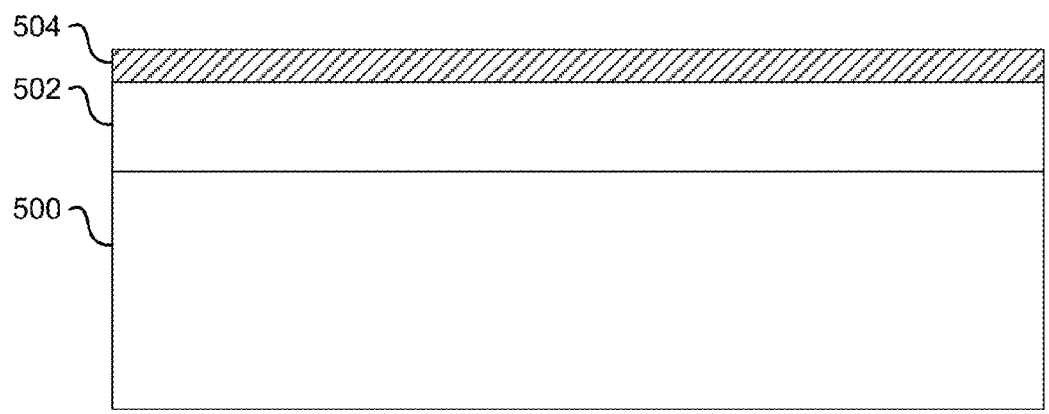

FIG. 5B illustrates the formation of a second GaN epitaxial layer 504 above the first GaN epitaxial layer 502. Second GaN epitaxial layer 504, from which edge termination structures are eventually formed and which can be used in forming the gates of the vertical JFET device, can have a conductivity type different than first GaN epitaxial layer 502. For instance, if first GaN epitaxial layer 502 is formed from an n-type GaN material, second GaN epitaxial layer 504 can be formed from a p-type GaN material, and vice versa. In some embodiments, second GaN epitaxial layer 504 used to form the edge termination structures is a continuous regrowth over portions of first GaN epitaxial layer 502 with other portions of the structure, such as regions of other semiconductor devices, characterized by reduced or no growth as a result of the presence of a regrowth mask (not shown). In an n-channel vertical JFET, for example, second GaN epitaxial layer 504 can comprise a p+ GaN epitaxial layer, and first GaN epitaxial layer 502 can include an n− GaN epitaxial layer. In general, the dopant concentration of second GaN epitaxial layer 504 can exceed the dopant concentrations of first GaN epitaxial layer 502. For example, an p-type dopant concentration of second GaN epitaxial layer 504 can be equal to or greater than $1\times10^{18}$ cm$^{-3}$. One of ordinary skill in the art would recognize many variations, modifications, and alternatives.

The thickness of second GaN epitaxial layer 504 can vary, depending on the process used to form the layer and the device design. In some embodiments, the thickness of second GaN epitaxial layer 504 is between 0.1 μm and 5 μm. One method of forming second GaN epitaxial layer 504, and other layers described herein, can be through a regrowth process that uses an in-situ etch and diffusion preparation processes.

Figure 5C:
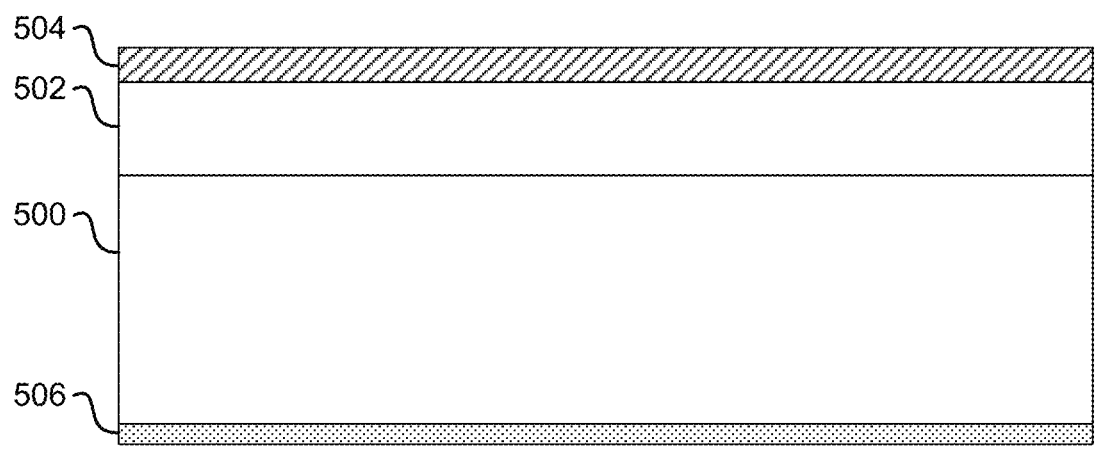

FIG. 5C illustrates the formation of a first metallic structure 506 below GaN substrate 500. First metallic structure 506 can be one or more layers of metal that serve as a Ohmic contact and comprise the drain electrode of the vertical JFET device. For example, metallic structure 506 can comprise a titanium-aluminum (Ti/Al) stack. Other metals and/or alloys can be used including, but not limited to, aluminum, nickel, gold, combinations thereof, or the like. In some embodiments, an outermost metal of first metallic structure 506 can include gold, tin, tantalum, tungsten, palladium, silver, or aluminum, combinations thereof, and the like. First metallic structure 506 can be formed using any of a variety of methods such as sputtering, evaporation, or the like.

Figure 6A:
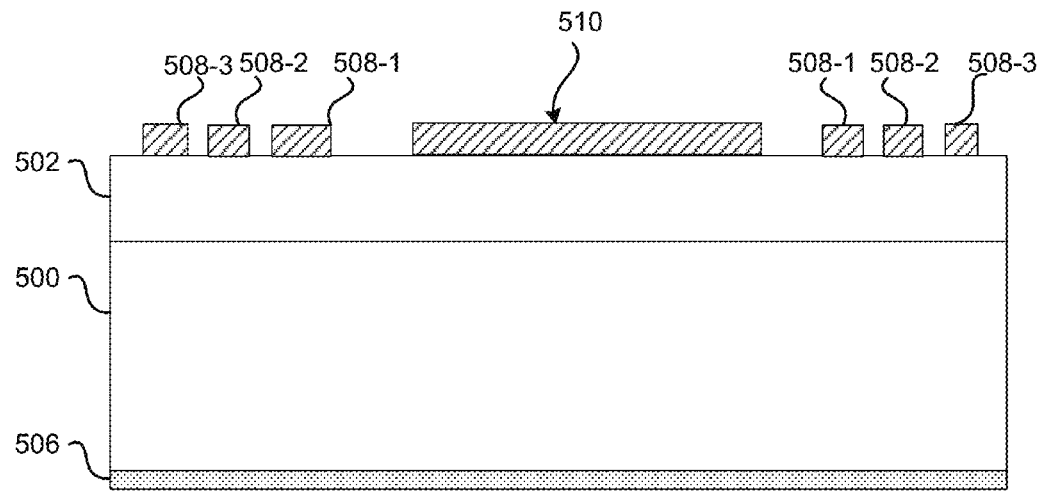

FIG. 6A is a simplified cross-sectional diagram illustrating the removal at least a portion of second GaN epitaxial layer 504 to form edge termination structures 508. As discussed in further detail below, edge termination structures 508 can include any of a variety of structures, such as guard rings that circumscribe the vertical JFET to provide edge termination. The removal can be performed by a controlled etch using an etch mask (not shown but having the dimensions of the edge termination structures 508) designed to stop at approximately the interface between second GaN epitaxial layer 504 and first GaN epitaxial layer 502. Inductively-coupled plasma (ICP) etching and/or other common GaN etching processes can be used. In the illustrated embodiment, the material removal process used to remove portions of second GaN epitaxial layer 504 terminates at the interface of layers 504 and layer 502, however, in other embodiments, the process terminates at a different depth, for example, extending into or leaving a portion of first GaN epitaxial layer 502.

In other embodiments, edge termination structures may be formed by implanting ions into portions of second GaN epitaxial layer 504 to electrically isolate edge termination structures 508. In other embodiments, the edge termination region may comprise a junction-termination extension (JTE) region, one or more field plates, deep trench termination, and/or a combination of these or other edge termination structures.

FIG. 6A also illustrates the formation of the gate region of the vertical JFET device. As illustrated in FIG. 6A, a portion 510 of second GaN epitaxial layer 504 is left in place during the formation of edge termination structures 508. Portion 510 will eventually form the gate region of the vertical JFET device. The area of gate portion 510 can be controlled by using an appropriate mask.

Figure 6B:
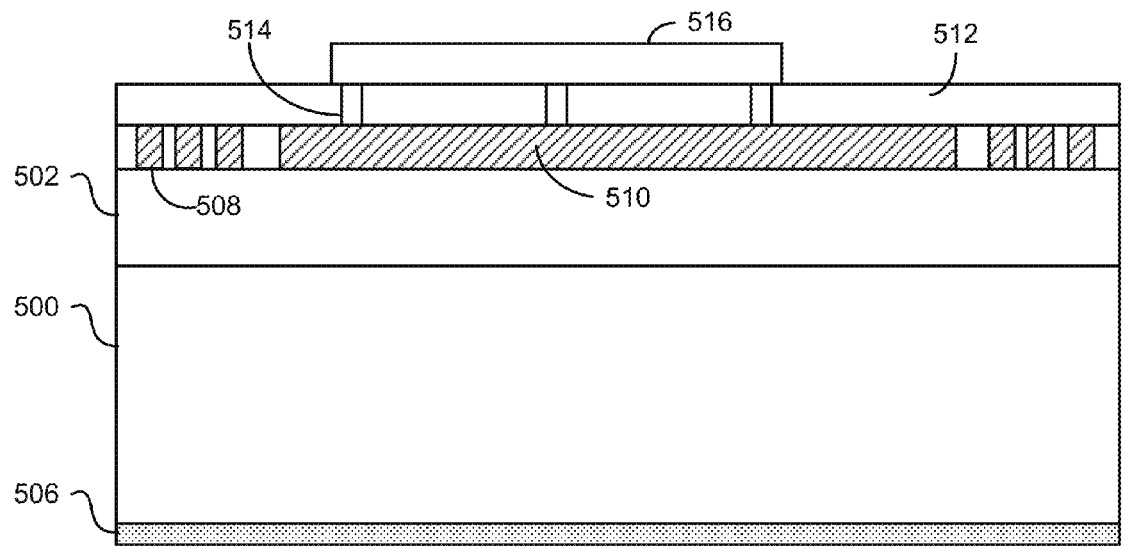

A dielectric layer 512 is formed overlying edge termination structures 508 and gate portion 510 as illustrated in FIG. 6B. In some embodiments, dielectric layer 512 can comprise silicon dioxide, silicon nitride, spin on glass, or another suitable material. Dielectric layer 512 can be formed using a variety of deposition techniques including plasma enhanced chemical vapor deposition (PECVD), low pressure chemical vapor deposition (LPCVD), spin on, or others. Dielectric layer 512 helps to electrically isolate the source electrode from underlying gate regions, as described below in reference to FIG. 7B. In one embodiment, dielectric layer 512 can be completely removed from under the gate electrode, allowing the gate electrode to directly contact portion 510. In other embodiments, one or more gate contacts 514 are formed passing through dielectric layer 512 to provide an electrical connection from gate electrode 516 to the gate portion 510. Gate electrode 516 can be one or more layers of metal that provide an Ohmic contact to the gate of the vertical JFET. For example, metallic structure 516 can comprise a titanium-aluminum (Ti/Al), nickel, platinum, palladium, or other suitable material. Gate electrode 516 can be formed using any of a variety of methods such as sputtering, evaporation, or the like.

Figure 7A:
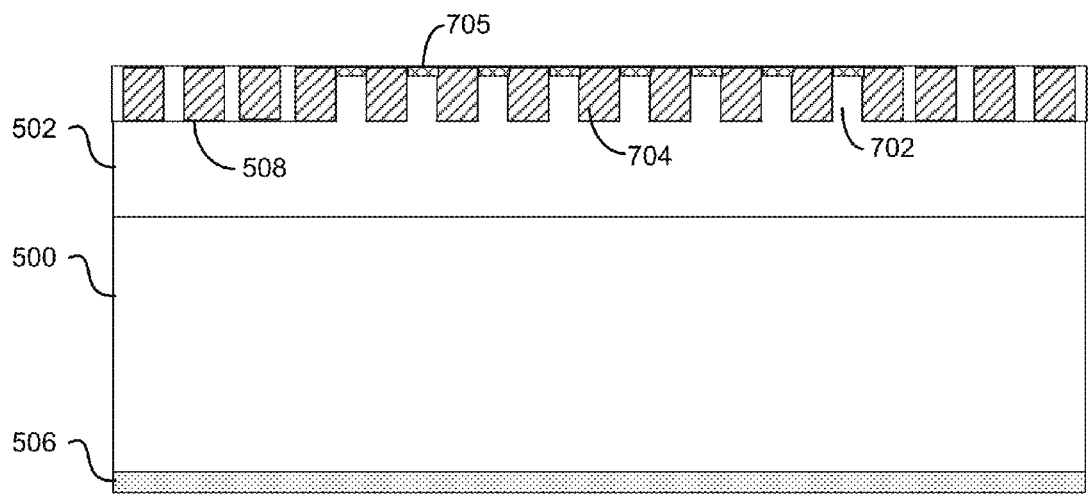
Figure 7B:
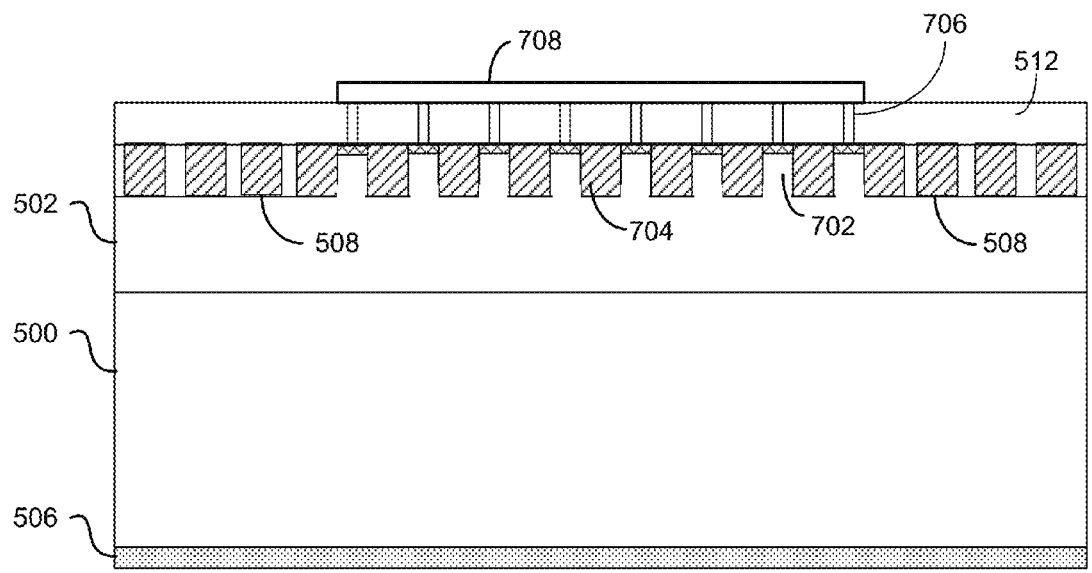

FIGS. 7A and 7B illustrate formation of channel regions, source regions, and source contacts according to an embodiment of the present invention. As illustrated in FIG. 7A, a channel in form of one or more elongated channel regions 702 can be formed from an epitaxial layer of the same conductivity type as the first GaN epitaxial layer 502. In one embodiment, channel regions 702 are formed from a portion of first GaN epitaxial layer 502 by etching to remove portions of GaN epitaxial layer 502. Gate regions 704 can be formed from the same epitaxial growth or regrowth as the edge termination structures 508, which has an opposite conductivity type as first GaN epitaxial layer 502. Channel regions 702 are formed such that they are positioned between sets of adjacent gate regions 704. Gate regions 704 are coupled to the planar continuous gate region 510 illustrated in FIG. 6B. Thus, continuous gate region 510 along with finger-shaped gate regions 704 together form the gate of the vertical power device. This is more clearly illustrated in FIG. 1. Source regions 705 may be disposed on the top of channel regions 702. Source regions 705 may have the same conductivity type (e.g. N-type) as channel regions 702 and substrate 500. The doping concentration of source regions 705 may be substantially higher than the doping concentration of channel regions 702, in order to form a better Ohmic contact.

As illustrated in FIG. 7B, source contacts 706 are formed and coupled to each source region 705. Each source contact 706 is then coupled to a source electrode 708 that overlies source regions 705 and gate regions 704. Dielectric layer 512 electrically isolates source electrode 708 from underlying gate regions 704. Source electrode 708, source regions 702, and gate regions 704 all are disposed within the edge termination structure 508. In other words, edge termination structures 508 completely surround source electrode 708, source regions 702, gate regions 704, and gate portion 510.

Figure 8:
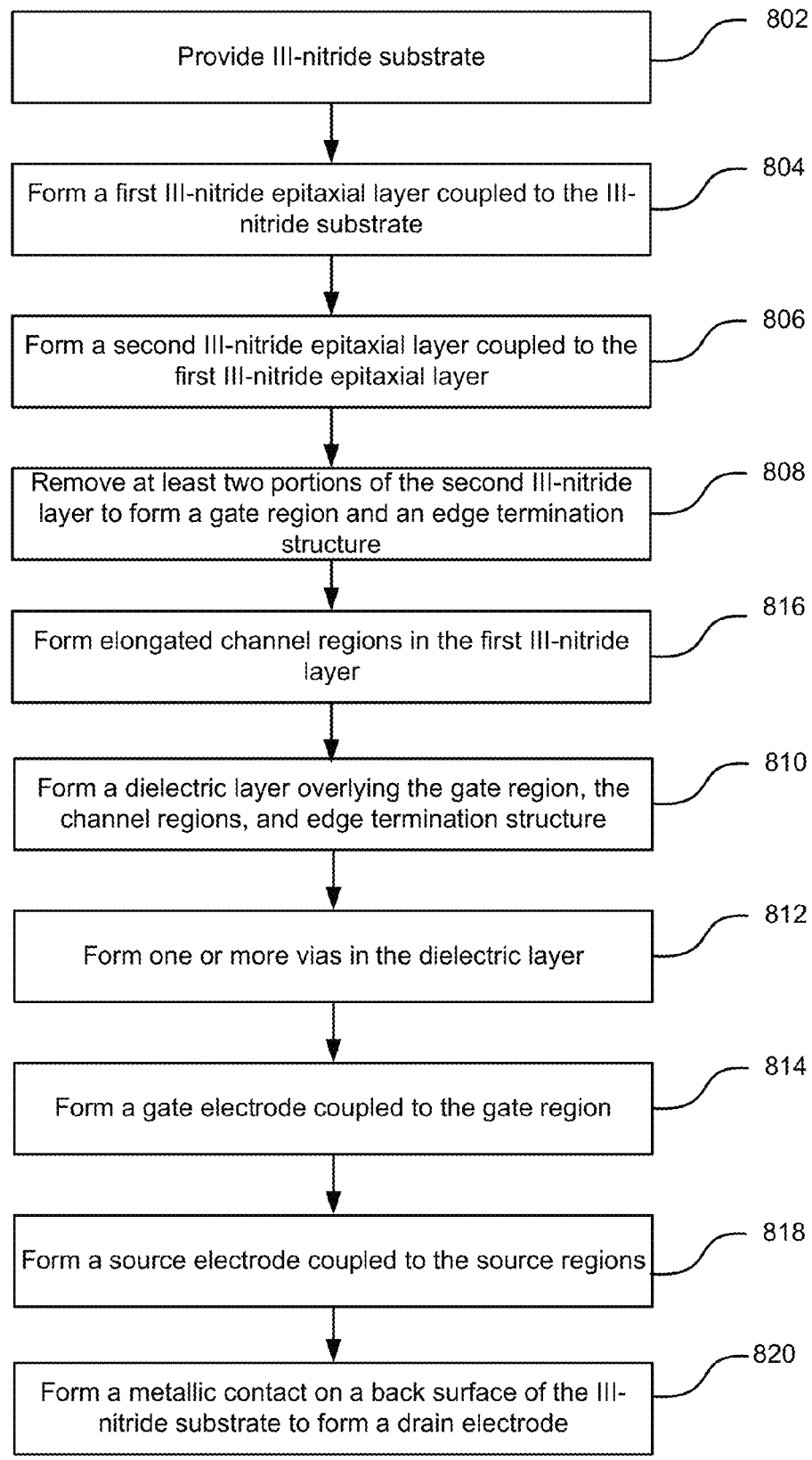
FIG. 8 is a simplified flowchart illustrating a method of fabricating a vertical JFET with edge termination structures enclosing a regrown gate region according to an embodiment of the present invention.

FIG. 8 is a simplified flowchart illustrating a method of fabricating a vertical JFET with edge termination structures enclosing a regrown gate region according to an embodiment of the present invention. A III-nitride substrate is provided (802). In an embodiment, the III-nitride is an n-type GaN substrate. The method also includes forming a first III-nitride epitaxial layer (e.g., an n-type GaN epitaxial layer) coupled to a front surface of the III-nitride substrate (804). The first III-nitride epitaxial layer is characterized by a first dopant concentration, for example n-type doping with dopant concentrations ranging from $1\times10^{14}\,cm^{-3}$ to $1\times10^{18}\,cm^{-3}$. Using the homoepitaxy techniques described herein, the thickness of the first III-nitride epitaxial layer can be thicker than available using conventional techniques, for example, between about 1 µm and about 100 µm.

The method includes forming a second III-nitride epitaxial layer of an opposite type from the first III-nitride epitaxial layer (e.g., a p-type GaN layer) coupled to the first III-nitride epitaxial layer (806). The dopant concentration of second III-nitride epitaxial layer may exceed the dopant concentrations of first III-nitride epitaxial layer. For example, a p-type dopant concentration of the second III-nitride epitaxial layer can be equal to or greater than $1\times10^{18}\,cm^{-3}$. The thickness of the second III-nitride epitaxial layer can vary, depending on the process used to form the layer and the device design. In some embodiments, the thickness of second III-nitride epitaxial layer is between 0.1 µm and 5 µm.

This second III-nitride epitaxial layer forms a gate region at least partially surrounding the channel region previously fabricated. At least two portions of the second III-nitride epitaxial layer are isolated from each other to form at least one edge termination structure, and a gate region that includes a planar continuous gate region and one or more finger-shaped elongated gate regions (808).

In another section of the vertical power device, the first III-nitride layer is patterned and etched to create one or more elongated channel regions (816). The channel regions are created such that each source region is flanked by the elongated gate region on either side. Source regions may be included at the top of each channel region, the source regions having the same doping type as, and higher doping concentration than, the first III-nitride epitaxial layer.

In some embodiments, up to seven edge termination structures can be formed to provide edge termination for the vertical power device. In other embodiments, more than seven edge termination structures may also be formed. Furthermore, the edge termination structures can be shaped in any of a variety of shapes based on the physical characteristics of the vertical power device and other considerations. The edge termination structure may be isolated from the gate portion using various techniques. In one embodiment, at least a portion of the second III-nitride epitaxial layer may be removed to isolate two portions of the second III-nitride epitaxial layer from each other. In other embodiments, isolation may be achieved by implanting ions into portions of the second III-nitride epitaxial layer. The edge termination structure may comprise a variety of features as appropriate to achieve the desired voltage sustaining capability. For example, the edge termination structure may comprise floating rings, a junction-termination extension (JTE) region, one or more field plates, deep trench termination, and/or a combination of these or other edge termination structures.

The method further includes forming a dielectric layer overlying the edge termination structures, the channel regions, and the gate region (810). Thereafter one or more vias are formed in the dielectric layer to provide electrical connection to the gate region and the channel regions, or in some embodiments the source regions atop the channel regions (812). A gate electrode is formed over the dielectric layer and is coupled to the gate region through the vias (814) and a source electrode is formed over the dielectric layer and is coupled to the channel (and/or source) regions through other vias (818). The various epitaxial layers used to form the vertical power device and edge termination structures do not have to be uniform in dopant concentration as a function of thickness, but may utilize varying doping profiles as appropriate to the particular application.

The method also includes forming a metallic structure on the back surface of the III-nitride substrate that is electrically coupled to the III-nitride substrate (820). This metallic structure functions as the drain electrode for the vertical power device.

It should be appreciated that the specific steps illustrated in FIG. 8 provide a particular method of fabricating a vertical power device with edge termination structures according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

One of ordinary skill in the art would recognize many variations, modifications, and alternatives to the examples provided herein. As illustrated herein, edge termination structures can be provided in any of a variety of shapes and forms, depending on physical features of the semiconductor device for which the edge termination structures provide edge termination. Additionally or alternatively, conductivity types of the examples provided herein can be reversed (e.g., replacing an n-type semiconductor material with a p-type material, and vice versa), depending on desired functionality. Moreover, embodiments provided herein using GaN can use other III-nitride materials in addition or as an alternative to GaN. Other variations, alterations, modifications, and substitutions are contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of manufacturing a vertical junction field effect transistor (VJFET), the method comprising:
    providing a III-nitride substrate;
    forming a first III-nitride layer coupled to the substrate, wherein the first III-nitride layer has a first conductivity type;
    after forming the first III-nitride layer, forming a plurality of gate projections in a second III-nitride layer, wherein the second III-nitride layer has a second conductivity type;
    after forming the gate projections, forming a plurality of channel regions in the first III-nitride layer, wherein the channel regions are interleaved with the gate projections; and
    forming a plurality of source regions in a third III-nitride layer, wherein the third III-nitride layer has the first conductivity type, and wherein each of the source regions is coupled to one of the channel regions.

2. The method of claim 1, wherein forming the channel regions comprises epitaxially growing the channel regions in the first III-nitride layer.

3. The method of claim 1, further comprising forming an edge termination structure surrounding the channel regions, the gate projections, and the source regions.

4. The method of claim 1, wherein a drain is at least partly formed by a portion of the III-nitride substrate.

5. The method of claim 1, wherein:
    the III-nitride substrate comprises GaN;
    the first III-nitride layer comprises GaN;
    the second III-nitride layer comprises GaN; and
    the third III-nitride layer comprises GaN.

6. The method of claim 1, further comprising:
    forming a source electrode electrically connected to the source regions;
    forming a gate electrode electrically connected to the gate projections; and
    forming a drain electrode electrically connected to the III-nitride substrate.

7. The method of claim 6, wherein the drain electrode is coupled a first side of the III-nitride substrate, wherein the source electrode is coupled to a second side of the III-nitride substrate, and wherein the second side of the III-nitride substrate is opposite the first side of the III-nitride substrate.

8. The method of claim 6, wherein the drain electrode is directly connected to the III-nitride substrate.

9. The method of claim 6, further comprising connecting the source electrode to the source regions via a plurality of contacts.

10. The method of claim 6, further comprising connecting the gate electrode to the gate projections via a continuous portion of the second III-nitride layer.

11. A vertical junction field effect transistor (VJFET) formed by a method comprising:
    providing a III-nitride substrate;
    forming a first III-nitride layer coupled to the substrate, wherein the first III-nitride layer has a first conductivity type;
    after forming the first III-nitride layer, forming a plurality of gate projections in a second III-nitride layer, wherein the second III-nitride layer has a second conductivity type,
    after forming the gate projections, forming a plurality of channel regions in the first III-nitride layer, wherein the channel regions are interleaved with the gate projections; and
    forming a plurality of source regions in a third III-nitride layer, wherein the third III-nitride layer has the first conductivity type, and wherein each of the source regions is coupled to one of the channel regions.

12. The VJFET of claim 11, wherein forming the channel regions comprises epitaxially growing the channel regions in the first III-nitride layer.

13. The VJFET of claim 11, wherein the method further comprises forming an edge termination structure surrounding the channel regions, the gate projections, and the source regions.

14. The VJFET of claim 11, wherein a drain is at least partly formed by a portion of the III-nitride substrate.

15. The VJFET of claim 11, wherein:
    the III-nitride substrate comprises GaN;
    the first III-nitride layer comprises GaN;
    the second III-nitride layer comprises GaN; and
    the third III-nitride layer comprises GaN.

16. The VJFET of claim 11, wherein the method further comprises:
   forming a source electrode electrically connected to the source regions;
   forming a gate electrode electrically connected to the gate projections; and
   forming a drain electrode electrically connected to the III-nitride substrate.

17. The VJFET of claim 16, wherein the drain electrode is coupled a first side of the III-nitride substrate, wherein the source electrode is coupled to a second side of the III-nitride substrate, and wherein the second side of the III-nitride substrate is opposite the first side of the III-nitride substrate.

18. The VJFET of claim 16, wherein the drain electrode is directly connected to the III-nitride substrate.

19. The VJFET of claim 16, wherein the method further comprises connecting the source electrode to the source regions via a plurality of contacts.

20. The VJFET of claim 16, wherein the method further comprises connecting the gate electrode to the gate projections via a continuous portion of the second III-nitride layer.

* * * * *